United States Patent
Mayo et al.

(10) Patent No.: US 8,516,302 B2
(45) Date of Patent: Aug. 20, 2013

(54) AUTOMATIC ERROR CONTROL SCHEME SELECTION FOR FIXED-LENGTH MESSAGES BASED UPON MESSAGE PAYLOAD SIZE

(75) Inventors: Thomas Clayton Mayo, Honeoye Falls, NY (US); Kenneth Roy Tuttle, Pittsford, NY (US); Richard Alan Place, Canandaigua, NY (US)

(73) Assignee: General Electric Company, Schenectady, NY (US)

( * ) Notice: Subject to any disclaimer, the term of this patent is extended or adjusted under 35 U.S.C. 154(b) by 587 days.

(21) Appl. No.: 12/761,597

(22) Filed: Apr. 16, 2010

(65) Prior Publication Data

US 2011/0258511 A1 Oct. 20, 2011

(51) Int. Cl.
*G06F 11/00* (2006.01)
(52) U.S. Cl.
USPC ............. 714/16; 714/758; 714/756; 714/755; 370/242
(58) Field of Classification Search
None
See application file for complete search history.

(56) References Cited

U.S. PATENT DOCUMENTS

| | | | | |
|---|---|---|---|---|
| 5,526,399 A * | 6/1996 | Kameda | ...................... | 455/74.1 |
| 6,519,731 B1 * | 2/2003 | Huang et al. | .................. | 714/751 |
| 6,546,025 B1 * | 4/2003 | Dupuy | .......................... | 370/509 |
| 7,145,876 B2 * | 12/2006 | Huang et al. | ..................... | 370/232 |
| 7,983,289 B2 * | 7/2011 | Yamanaka et al. | ............ | 370/428 |
| 2001/0036154 A1 * | 11/2001 | Takagi | .......................... | 370/229 |
| 2002/0137467 A1 * | 9/2002 | Tzannes | ......................... | 455/69 |
| 2004/0129840 A1 * | 7/2004 | Horst | ............................ | 246/186 |
| 2005/0078615 A1 * | 4/2005 | Muri | ............................. | 370/277 |
| 2006/0013130 A1 * | 1/2006 | Bloebaum | ..................... | 370/229 |
| 2011/0188501 A1 * | 8/2011 | Kim et al. | ..................... | 370/390 |
| 2012/0202420 A1 * | 8/2012 | Horiguchi | ....................... | 455/39 |

OTHER PUBLICATIONS

Newton's Telecom Dictionary, 18th Ed., Harry Newton, CMP Books, 2002, p. 618.*

* cited by examiner

*Primary Examiner* — Christopher McCarthy
(74) *Attorney, Agent, or Firm* — GE Global Patent Operation; Catherine J. Toppin (57) ABSTRACT

A communication system enabling wireless transmission of messages via packets; and a method of operating the system provides for improved accuracy in the transmission of a message, particularly for overcoming signal distortion associated with the phase changes and varying multipath found in transmissions from the locomotive of a moving train. The maximum benefit of forward-error correction (FEC) with Reed-Solomon (RS) coding is applied for a message payload that is significantly shorter than the fixed length of a packet, with lesser coding being performed with longer payloads.

14 Claims, 8 Drawing Sheets

| RSSI | Packet Loss%<br>No FEC | Packet Loss%<br>Reed Solomon FEC |
|---|---|---|
| -90 dBm | 0% | 0% |
| -100 dBm | 27% | 0% |
| -103 dBm | 88% | 2% |
| -110 dBm | 100% | 81% |

FIG. 7

AUTOMATIC ERROR CONTROL SCHEME SELECTION FOR FIXED-LENGTH MESSAGES BASED UPON MESSAGE PAYLOAD SIZE

BACKGROUND OF THE INVENTION

The exemplary embodiments of the present invention generally relate to communication systems. More particularly, the exemplary embodiments relate to automatic error control in mobile, over-the-air communication systems.

In mobile, over-the-air communications, the combination of multipath effects and motion can be harmful to data communications. Multipath effects will cause the signal strength to vary dramatically from one receiving location to another receiving location, even when the locations are just a few feet apart. Motion, such as in mobile communications where the transmitter and/or receiver are moving, can introduce clicks on the demodulated waveform due to phase changes associated with the varying signal level. The multipath and motion combination can also introduce bit errors, resulting in an irreducible error rate. No matter how strong the signal is, there will be a high residual error rate.

Prior attempts to correct the errors resulting from multipath and motion in mobile, over-the-air communication systems have typically employed higher RF power, wider channel size, and more spectrally intrusive modulation schemes. Since messages sizes are rarely known a priori, it would be advantageous not to limit the size of all messages by encumbering every message with maximum error control, or by skipping strong error control for all messages, because some could be larger than others.

Accordingly, it would be desirable to provide a system that addresses at least some of the problems identified above.

BRIEF DESCRIPTION OF THE INVENTION

As described herein, the exemplary embodiments overcome one or more of the above or other disadvantages known in the art.

One aspect of the exemplary embodiments relates to a communication system enabling wireless transmission of messages via packets. In one embodiment the system comprises a transmitter and a receiver for transmission of the messages via a radio link employing packets of a fixed length. The messages may differ in length and there may be relative motion between the transmitter and the receiver. The communication system enables improved accuracy during the relative motion. Each packet includes a header identifying the length of a payload employed in the packet for the transmission of the message. The transmitter includes length-determining circuitry for determining whether a length of the message enables a first mode of error correction of the payload for minimal accuracy in the transmission of the message over the radio link, whether the length of the message is of a second length enabling a second mode of error correction for increased accuracy in the transmission of the message over the radio link. The transmitter selects a mode of coding for the best accuracy obtainable based on the length of the message.

Another aspect of the exemplary embodiments relates to a method of operating a communication system that enables wireless transmission of messages via packets, where the communication system comprises a transmitter and a receiver for transmission of the messages via a radio link employing packets of a fixed length, wherein the messages may differ in length and wherein there may be relative motion between the transmitter and the receiver, the communication system enabling improved accuracy during the relative motion and the packets includes a header identifying the length of a payload employed in the packet for transmission of a message. In one embodiment the method includes determining, at the transmitter, whether a length of the message is of a first length enables a first mode of error correction of the payload for minimal accuracy in the transmission of the message over the radio link, whether the length of the message is of second length enabling a second mode of error correction for increased accuracy in the transmission of the message over the radio link. The transmitter selects a mode of coding for the best accuracy obtainable based on the length of the message.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Moreover, the drawings are not necessarily drawn to scale and that, unless otherwise indicated, they are merely intended to conceptually illustrate the structures and procedures described herein. In addition, any suitable size, shape or type of elements or materials could be used.

BRIEF DESCRIPTION OF THE DRAWINGS

In the drawings:

FIGS. 6A and B are graphs comparing packet loss percentages without forward error correction to packet loss percentages with error correction in a system incorporating aspects of the disclosed embodiments.

DETAILED DESCRIPTION OF THE EXEMPLARY EMBODIMENTS OF THE INVENTION

Figure 1:
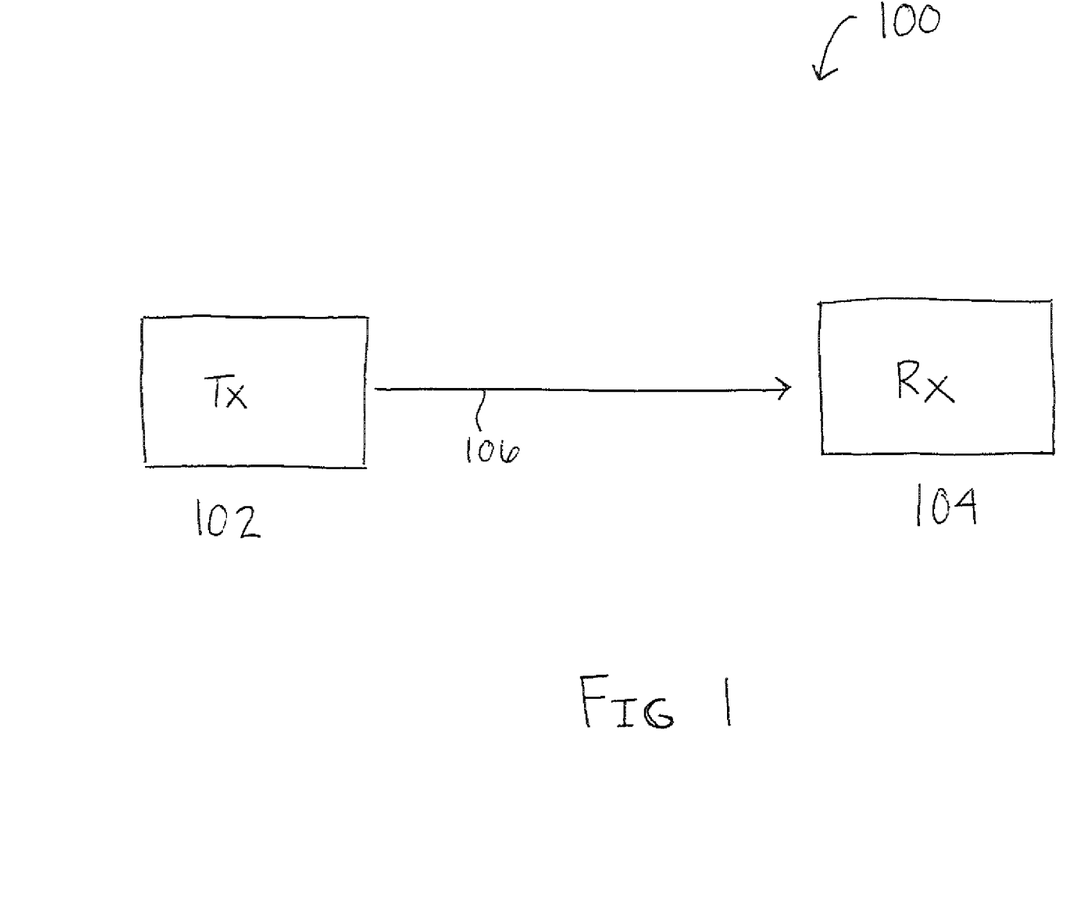
FIG. 1 is a schematic block diagram of an exemplary system incorporating aspects of the disclosed embodiments.

FIG. 1 illustrates an exemplary communication system 100 incorporating aspects of the disclosed embodiments. Generally, the communication system 100 comprises a transmit side 102 and a receive side 104. Signals or messages 106, in the form of packets, are transmitted. In one embodiment, the transmit side 102 comprises a radio in a locomotive, for example. A fixed packet size, such as 133 bytes for example, is employed for over-the-air transmission from the transmit side 102 to the receiving side 104.

The aspects of the disclosed embodiments generally provide a communication system and method that enables wireless transmission of messages via packets with improved accuracy. The disclosed embodiments particularly relate to overcoming signal distortion associated with the phase changes and varying multipath in over-the-air radio transmissions, particularly when at least one of the transmitting side 102 or receiving side 104 is moving, as will generally be understood. One example of such radio transmissions are those found, for example, in radio transmissions from a moving train. The use of Reed-Solomon (RS) block codes can greatly improve the reliability of wireless data communication links. In accordance with the aspects of the disclosed embodiments, the maximum benefit of forward-error correction (FEC) with Reed-Solomon block coding is applied to a message payload that is significantly shorter than the fixed length of the packet, with lesser coding being performed and applied to messages with longer payloads. For example, a maximum packet size can be considered to be 133 bytes, which permits 2 bytes of Cyclic Redundancy Check (CRC). A packet size of 117 bytes will allow the 16 bytes required for forward error correction. A packet can be considered too large for forward error correction if the payload size is greater than 117 bytes, but less than the maximum packet size of 133 bytes, in which case a CRC is calculated for the entire packet and is appended to the packet.

In one embodiment, in order to maximize the chances of receiving the correct or error-free message at the receiving end 104 of the link, the message 106 is transmitted from the transmitting side 102 with a header, protected by heavy error control coding, that also indicates the type of message that is being sent. According to the aspects of the disclosed embodiments, the error control coding options are generally dependent upon the size of the message. The message types and options generally include: a message up to 117 bytes with 16 bytes of Reed-Solomon FEC and a message up to 133 bytes with CRC coding. The error control options applied herein are triggered by the size of the message to be sent. The aspects of the disclosed embodiments allow the use of strong error control, such as Reed-Solomon forward error correction, which is necessary for mobile applications, with minimal power consumption (RF power output) but maximum reliability. Further, it permits large messages to be sent if necessary. Large messages are, for example, file downloads that do not have to occur in real time. Smaller messages are typically those that are needed for real time control over the air.

FIG. 1 illustrates one example of a packet transmission system 100 incorporating aspects of the disclosed embodiments. Generally, in a system 100 such as that shown in FIG. 1, one or more messages are delivered or otherwise provide in a suitable manner to the transmitter side or radio 102 for transmission over the air. In one embodiment, the transmitter system 102 determines the length of the message, also referred to herein as a payload, to be sent. If the payload is greater than 117 bytes such as 133 bytes, the payload is sent with minimal error control over the air, such as 2-bytes of CRC. If the payload is 117 bytes or less, the payload is sent with 16-bytes of Reed-Solomon forward error correction.

In one embodiment, at least one of the transmitter 102 and receiver 104 is located at a fixed site or location of the radio link 100. The other side of the link 100, the transmitter 102 or receiver 104 is located on a vehicle that is moving relative to the fixed site. In one embodiment, the transmitter 102 and/or receiver 104 is located in a locomotive of a train. The system 100 is generally configured to improve the accuracy and reliability of the transmission of messages over-the-air via a radio link 100 that employs message packets of a fixed, maximum length. Generally, each packet will include a header that identifies the length of the payload employed in the packet for transmission of a message. The transmitter 102 determines the length of the payload, and whether the message is of a length to which error correction coding can be applied. The transmitter 102 selects a mode or method of coding that is suited to provide the best accuracy and reliability based on the determined length of the message. The error correction coding methods include forward-error correction of the payload for minimal accuracy in the transmission of the message over the radio link, e.g. CRC without the Reed-Solomon FEC coding for moderate accuracy in the transmission of the message over the radio link and a combination of CRC and RS FEC for enhanced or increased accuracy in the transmission of the message over the radio link.

Figure 2:
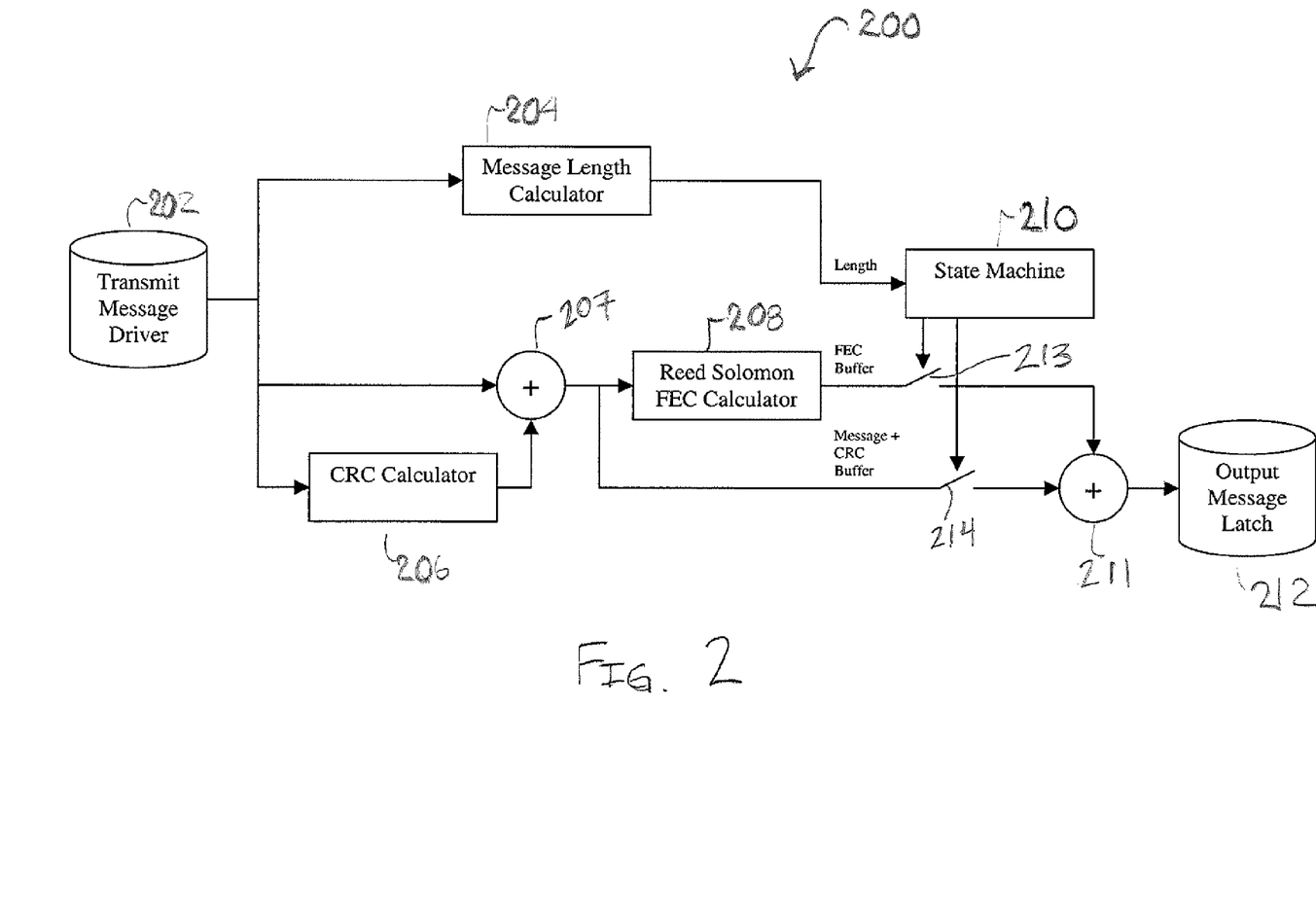
FIG. 2 is a schematic block diagram of the transmission side of a communication system incorporating aspects of the disclosed embodiments

FIG. 2 illustrates one example of a transmission system or side 102 of the communication link 100 shown in FIG. 1. In one embodiment, a transmit message driver 202 receives a message to be transmitted over-the-air. As described herein, the message will typically be in the form of a fixed-length packet. The packet will include a header that identifies a length of the payload of the packet.

In one embodiment, as shown in FIG. 2, when a message is supplied to the Transmit Message Driver 202 for transmission over the air, the Message Length Calculator 204 computes the length of the message. The length from the Message Length Calculator 204 drives the decision logic in the State Machine 210 to determine if the FEC should be appended to the message, based on the determined length of the message. The decision logic applied by the State Machine 210 generally includes three error correction options, based in the determined length of the message. If the message or payload is larger than 117, e.g., 133 bytes, the maximum size of a packet in these examples, the payload is considered too long to apply error correction, and the message is sent with minimal error correction, which in this example is 2-bytes of CRC. When the determined length of the message is 117 bytes or less, the length allows 16-bytes of Reed-Solomon forward error correction to be applied.

In one embodiment, a Concatenator 207 is configured to append the CRC value to the end of the message. Another Concatenator 211 is configured to either append the FEC to the message and CRC, or send the message and CRC alone based upon the message length determinations by the State Machine 210, as state selection switches 213 and 214 are driven. The message 106 to be transmitted over the air, with the error correction appended as noted above, is then latched into the Output Message Latch 212 and sent accordingly.

Figure 3:
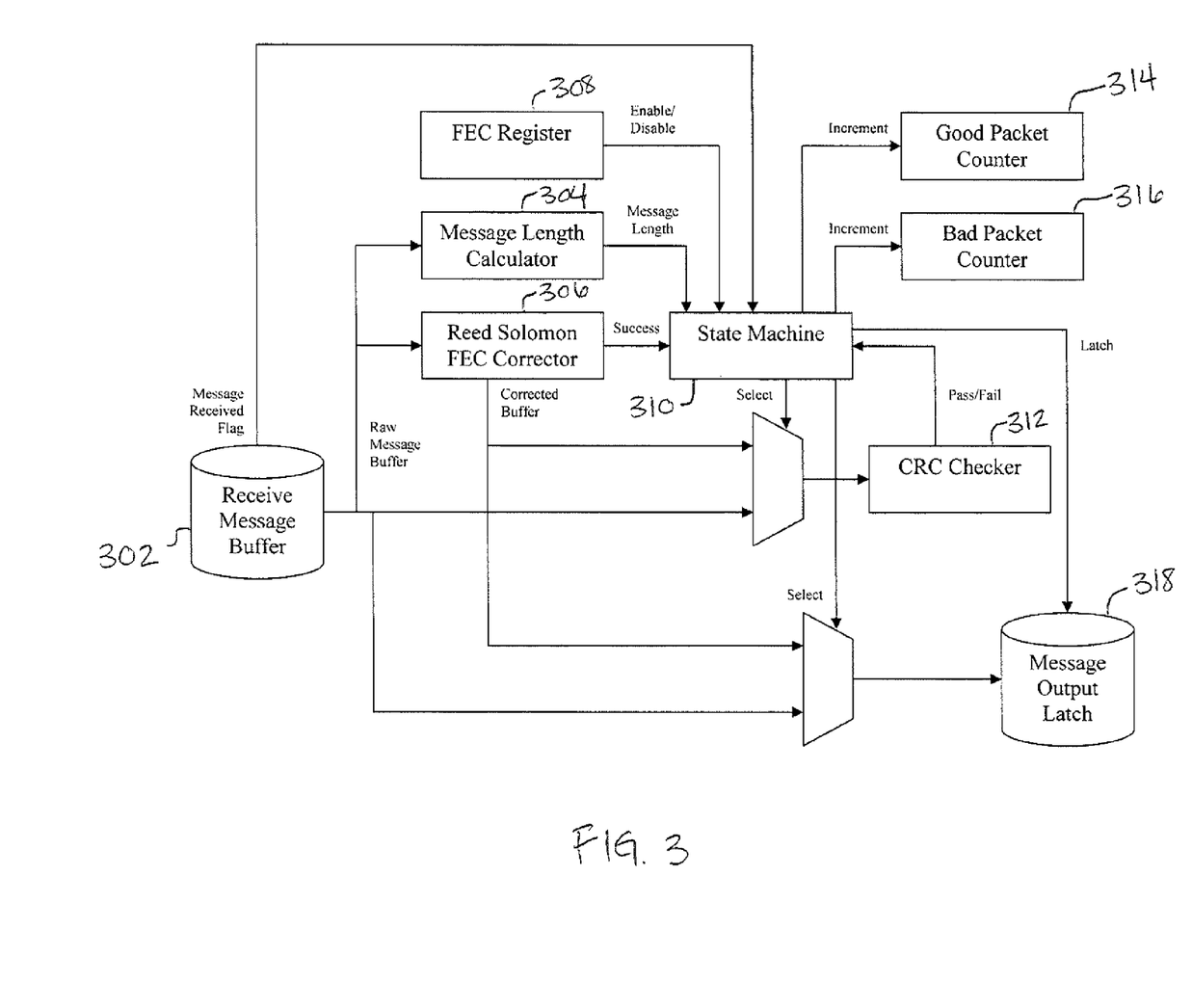
FIG. 3 is a schematic block diagram of the receive side of a communication system incorporating aspects of the disclosed embodiments.

FIG. 3 illustrates one example of the receive side 104 of the communication link 100 shown in FIG. 1. In one embodiment, the transmitted message 106 is received in a receive message buffer 302. When the message 106 is received over the air into the Receive Message Buffer 302, in one embodiment, a flag alerts the State Machine 310 to begin processing. The Message Length Calculator 304 is configured to compute the apparent length of the message 106, in Bytes. As noted earlier, the size of the message determines the type of error correction coding that is applied.

In one embodiment, the Reed Solomon FEC Corrector 306 modifies a copy of the received message based upon the Reed Solomon method of correcting data, based upon the additional bytes of data. This block can correct up to and including 8 Byte errors for the 16 extra Bytes that can be sent over the air. The Reed Solomon FEC Corrector 306 indicates to the State Machine 310 whether or not the correction is successful.

Based upon the message length and a state of the FEC Enable/Disable Register 308, in one embodiment, the State Machine 310 selects one of either the Corrected Message or Raw Message to be supplied to the CRC Checker 312. The CRC Checker 312 indicates to the State Machine 310 whether or not the input message is intact (i.e. the CRC passes). Based upon the result of the CRC Check, the State Machine 310 will latch the corrected or raw message to the message output latch 318 for further processing or consumption and update the Good Packet Counter 314 or the Bad Packet Counter 316.

Figure 4:
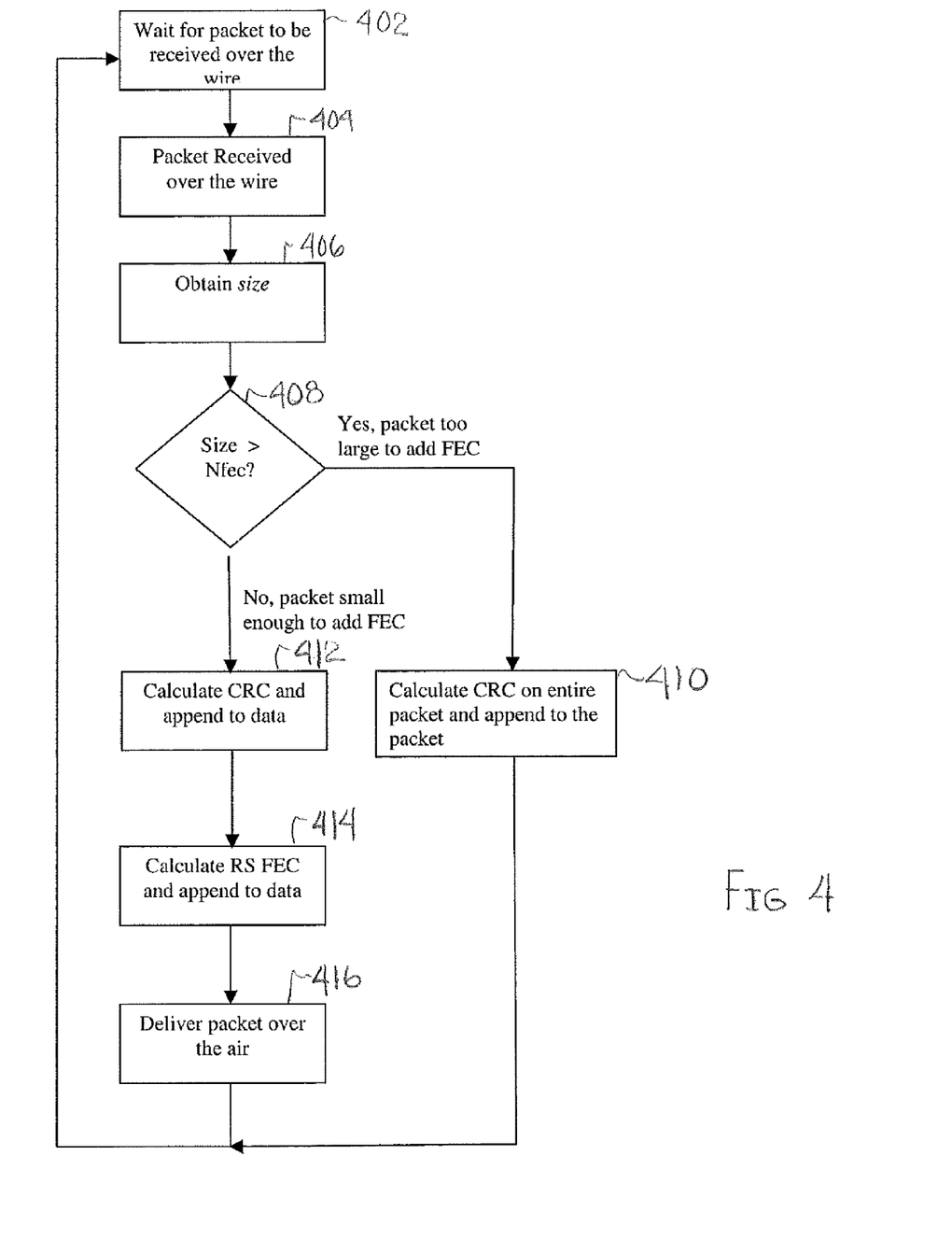
FIG. 4 illustrates an exemplary packet transmission process in a communication system incorporating aspects of the disclosed embodiments.

Referring to FIG. 4, an exemplary packet message transmit process flow incorporating aspects of the disclosed embodiments is illustrated. In one embodiment, the system waits 402 for the packet to be received 404. The size of the packet is determined 406. It is determined 408 whether the size of the packet is small enough to permit forward error correction. Generally, the maximum packet size can be considered to be 133 bytes, which permits 2 bytes of CRC. A packet size of 117 bytes will allow the 16 bytes required for forward error correction. In one embodiment, a packet will be considered too large for forward error correction if the payload size is greater than 117 bytes. If the packet is too large to add forward error correction, a CRC is calculated for the entire packet and is appended 410 to the packet. The packet with the CRC protection is then transmitted over the air 416.

If the packet size is small enough to be able to add forward error correction to it, a CRC is calculated 412 and appended to the data. A Reed Solomon forward error correction code is calculated and also appended 414 to the data. The modified packet is then transmitted 414 over the air. For example, if it is determined 408 that the packet size is 117 bytes or smaller, the CRC is calculated and appended, the Reed-Solomon code is calculated and appended, and the packet is then transmitted. The packet with both CRC and Reed-Solomon protection is then transmitted over the air 416.

Figure 5A:
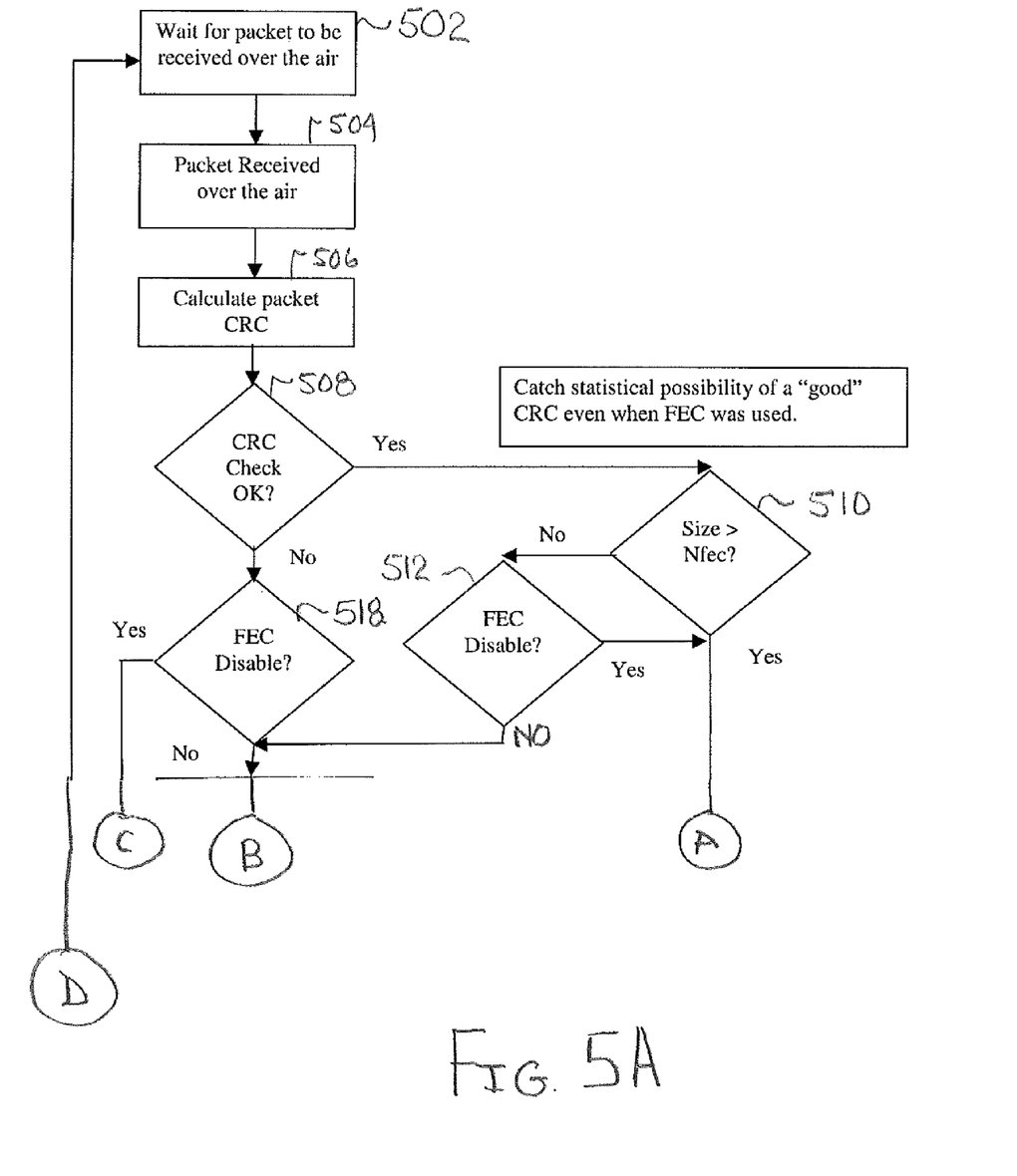
FIGS. 5A and 5B illustrate an exemplary packet receive process in a communication system incorporating aspects of the disclosed embodiments.
Figure 5B:
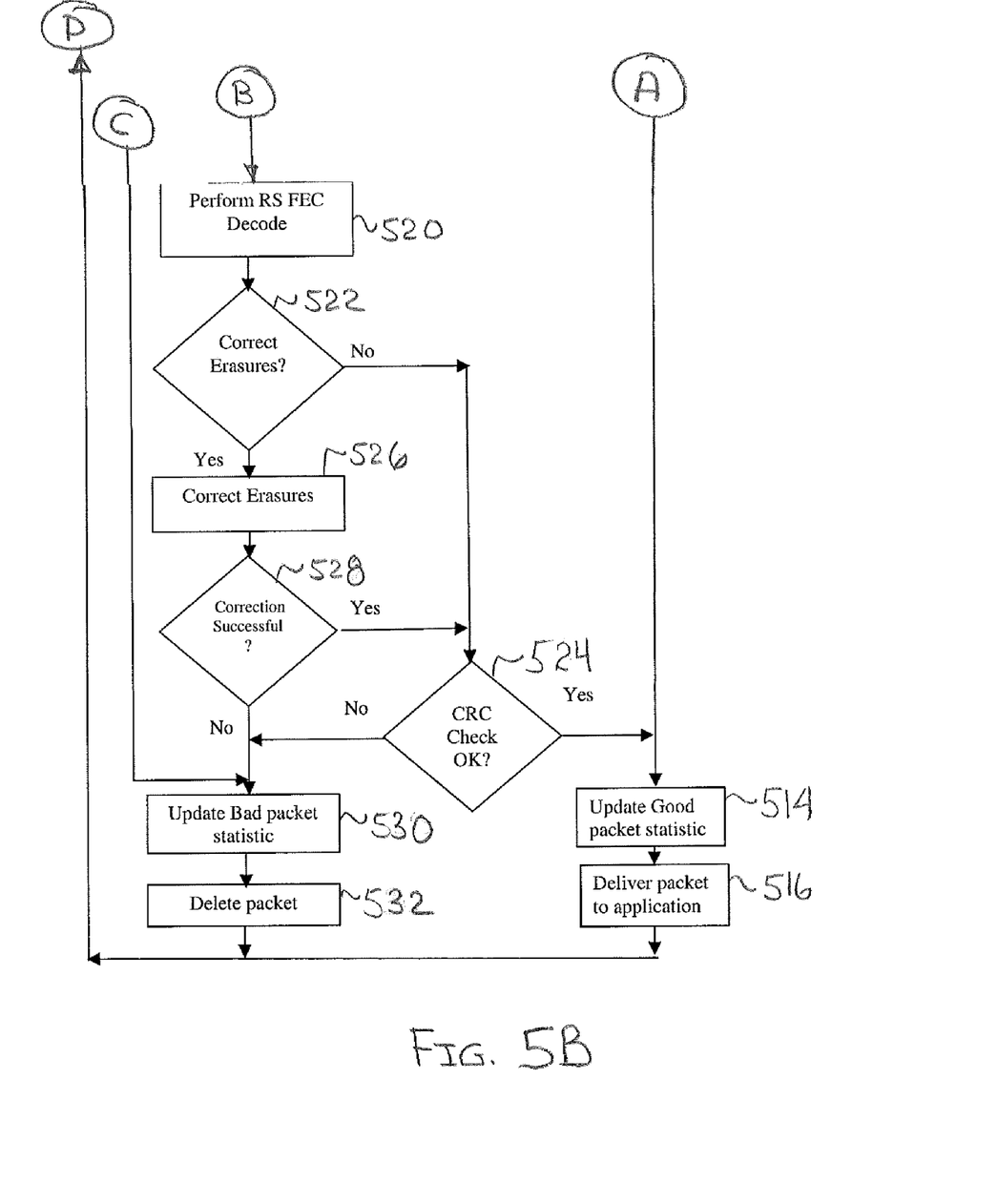

FIGS. 5A and 5B illustrate one embodiment of an exemplary packet receive process incorporating aspects of the disclosed embodiments. As shown in FIG. 5A, in one embodiment, the receiving system waits 502 for the packet to be received 504 over the air. When the packet is received 504, a CRC is calculated 506 for the packet and a CRC check 508 is carried out. If the CRC check is good, it is determined 510 whether the size of the received packet is greater than the number of message bytes permitting the use of added forward error correction. If the size of the packet is greater, then the packet is determined to be acceptable and the good packet statistic is updated 514 (FIG. 5B). If the size of the packet is not greater, it is determined 512 whether forward error correction for the packet has been disabled. If forward error correction has been disabled, the packet is determined to be acceptable and the good packet statistic is updated 514. The packet is then delivered 516 to the application, as shown in FIG. 5B.

If an error is determined in the CRC check 508, a determination 518 is made as to whether forward error correction is disabled. If the CRC check 508 indicates that the packet contains an error and forward error correction is disabled, the bad packet statistic is updated 530 and the packet is deleted 532. If the CRC check 508 indicates that the packet contains an error, but forward error correction is not disabled, a Reed Solomon forward error correction decoding process is carried out 520. A determination 522 is made as to whether to correct erasures. If not, another CRC check 524 is carried out. If the results of the CRC check are negative, the bad packet statistic is updated 530 and the packet is deleted 532.

If it is determined to correct erasures, a correct erasures step 526 is carried out. A determination 528 is made as to whether the correction was successful. If yes, the CRC check 524 is carried out. If the check is good, the good packet statistic is updated 514 and the packet delivered 516, and the application waits for the next packet 502. If the check shows an error, the bad packet statistic is updated 530 and the packet is deleted 532.

Figure 6:
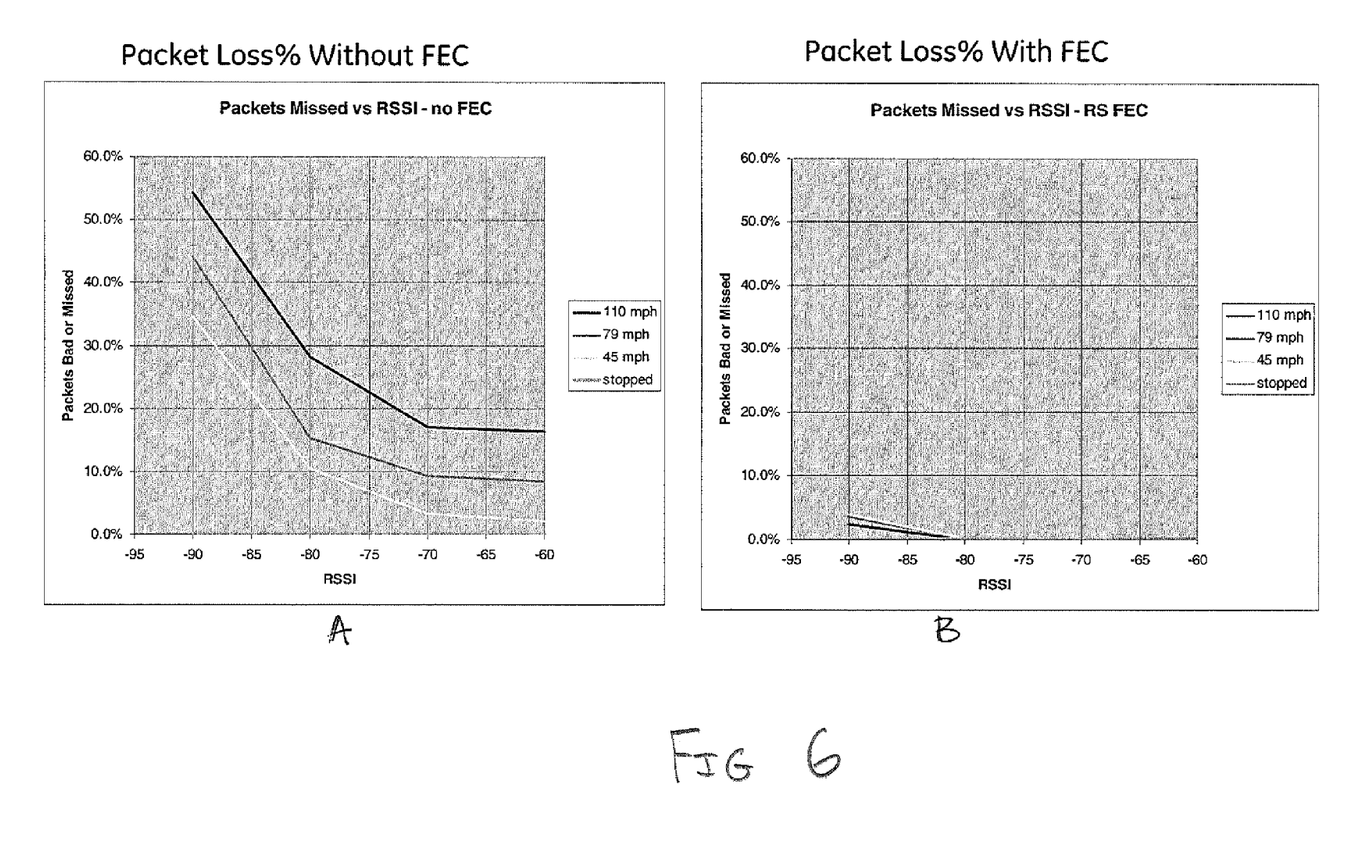

FIG. 6 illustrates the results of bit error rate, not considering motion, as measured on a GE MDS TD220 radio. The basic bit error rate is improved when Reed-Solomon FEC is applied in accordance with the aspects of the disclosed embodiments. The "RSSI" is "received signal strength indication", and is measured in dBm (decibels with respect to a milliwatt). The sensitivity of the radio is lower (better) than −100 dBm normally. In FIG. 6A, the error rate increases greatly when speed increases, even for strong RSSI, e.g. −70 to −60 dBm. As is seen, with no rate of travel, i.e. stopped, the error rate is 0% over the whole range of RSSI. This demonstrates the perhaps unexpected dramatic effect of motion on error rate. As shown in FIG. 6B, with FEC implemented as is disclosed herein, the error rate stays down even with high speed.

Figure 7:
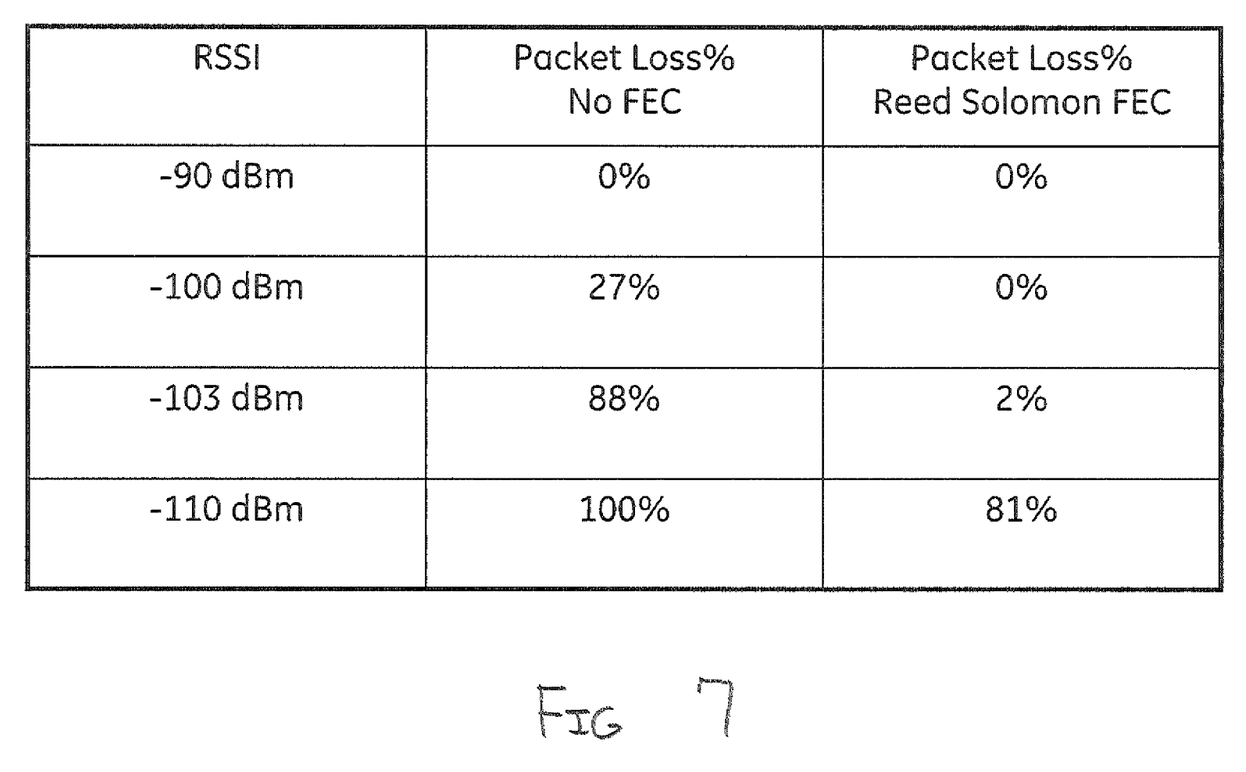
FIG. 7 is a table illustrating the measure results of packet loss percentage without forward error correction and with Reed-Solomon forward error correction in a system incorporating aspects of the disclosed embodiments.

The aspects of the disclosed embodiments address the problems related to multipath and motion errors in mobile, over-the-air communication systems. Forward error correction can substantially improve these errors by using a Reed Solomon code that adds 16 correction bytes to every 117 bytes of payload. The table of FIG. 7 shows a comparison of packet loss percentage without forward error correction and packet loss percentage with error correction. In these examples, 8 packets per second, 133 bytes each at 9600 bits per second, were received through a channel emulator with Rayleigh fading. As shown in the table of FIG. 7, there is a substantial reduction in packet loss percentage with forward error correction in a system implementing the aspects of the disclosed embodiments.

The use of forward error correction in the aspects of the disclosed embodiments also improves co-channel performance by simplifying frequency planning and allowing closer reuse of identical time slots on a channel.

The aspects of the disclosed embodiments thus generally provide a communication system enabling wireless transmission of messages via packets, and a method of operating the system provides for improved accuracy in the transmission of a message, particularly for overcoming signal distortion associated with the phase changes and varying multipath found in transmissions from the locomotive of a moving train. The maximum benefit of forward-error correction with Reed-Solomon coding is applied for a message payload that is significantly shorter than the fixed length of a packet, with lesser coding being performed with longer payloads.

Thus, while there have been shown and described and pointed out fundamental novel features of the invention as applied to the exemplary embodiments thereof, it will be understood that various omissions and substitutions and changes in the form and details of devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A communication system enabling wireless transmission of messages via packets, the communication system comprising:
   a transmitter and a receiver for transmission of the messages via a radio link employing packets of a fixed length, wherein each of the packets includes a header identifying a length of a payload employed in the packet for transmission of a message;
   message length-determining circuitry in the transmitter for determining a length of the message; and
   wherein the transmitter is configured to select a mode of error correction to be applied to the packet based on the length of the message, and wherein the transmitter is further configured to apply a first mode of error correction to the message for minimal accuracy in the transmission of the message over the radio link when the message is of a first length greater than 117 bytes and apply a second mode of error correction when the message is of a second length less than or equal to 117 bytes for additional accuracy in the transmission of the message over the radio link.

2. A communication system according to claim 1 wherein said first mode of error correction is cyclic-redundancy-check (CRC) of the message for minimal accuracy in the transmission of the message over the radio link and said second mode of error correction is CRC along with Reed-Solomon forward error correction (RS FEC).

3. A communication system according to claim 2 wherein one of said transmitter and said receiver is located at a fixed site of said radio link, and the other of said transmitter and said receiver is located on a vehicle movable relative to said fixed site.

4. A communication system according to claim 3 wherein said vehicle is a locomotive of a train.

5. A communication system according to claim 1, wherein when the length determining circuitry determines a length of the message to be larger than 117 bytes, the message is transmitted with cyclic-redundancy-check (CRC).

6. A communication system according to claim 1, wherein when the length determining circuitry determines a length of the message to be less than or equal to 117 bytes, the message is transmitted with 16-bytes of Reed-Solomon forward error correction.

7. A method of operating a communication system that enables wireless transmission of messages via packets; the communication system comprising:
   a transmitter and a receiver for transmission of the messages via a radio link employing packets of a fixed length, wherein each of the packets includes a header identifying the length of the message employed in the packet;
   wherein the method comprises:
   determining, at the transmitter, a length of the message, and applying a first mode of error correction to the message when the message is of a first greater than 117 bytes;
   applying a second mode of error correction for increased accuracy in the transmission of the message over the radio link when the message is of a second length less than or equal to 117 bytes.

8. A method according to claim 7 wherein the second message length is less than the first message length and is of a suitable length to include Reed Solomon forward error correction.

9. A method according to claim 8 wherein the first mode of error correction is 2-bytes of CRC and the second mode of error correction is 16 bytes of Reed Solomon forward error correction.

10. The method according to claim 8, wherein when a length of the message is determined to include a payload larger than 117 bytes, the message is transmitted with CRC.

11. A method according to claim 8, wherein when a length of the message is determined to include a payload of less than or equal to 117 bytes, the message is transmitted with 16-bytes of Reed-Solomon forward error correction.

12. A method according to claim 7 wherein said first mode of error correction is cyclic-redundancy-check (CRC) without Reed-Solomon (RS) forward error correction and said second mode of error correction is a combination of CRC and RS FEC for increased accuracy in the transmission of the message over the radio link.

13. A method according to claim 7 wherein one of said transmitter and said receiver is located at a fixed site of said radio link, the other of said transmitter and said receiver is located on a vehicle movable relative to said fixed site, and said selecting is accomplished at the transmitter irrespectively of whether the transmitter is located at the fixed site or at a mobile site of the vehicle.

14. A method according to claim 13 wherein said selecting is accomplished at said transmitter on the vehicle as the vehicle is functioning as a locomotive of a train.

* * * * *